US012751030B2

(12) United States Patent
Zheng et al.

(10) Patent No.: US 12,751,030 B2
(45) Date of Patent: Sep. 29, 2026

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Erhu Zheng, Shanghai (CN); Yizhou Ye, Shanghai (CN); Gaoying Zhang, Shanghai (CN)

(73) Assignees: Semiconductor Manufacturing International (Shanghai) Corporation, Shanghai (CN); Semiconductor Manufacturing International (Beijing) Corporation

(*) Notice: Subject to any disclaimer, the term of this patent is extended or adjusted under 35 U.S.C. 154(b) by 259 days.

(21) Appl. No.: 18/198,338

(22) Filed: May 17, 2023

(65) Prior Publication Data

US 2023/0290865 A1 Sep. 14, 2023

Related U.S. Application Data

(62) Division of application No. 17/245,483, filed on Apr. 30, 2021, now Pat. No. 11,695,062.

(30) Foreign Application Priority Data

Dec. 16, 2020 (CN) ........................ 202011487893.9

(51) Int. Cl.

*H10D 30/01* (2025.01)
*H10D 30/62* (2025.01)
(Continued)

(52) U.S. Cl.

CPC ....... *H10D 30/024* (2025.01); *H10D 30/6211* (2025.01); *H10D 84/0158* (2025.01); *H10D 84/038* (2025.01)

(58) Field of Classification Search

CPC ............. H10D 30/024; H10D 30/6211; H10D 84/0158; H10D 84/834; H10D 84/0151;
(Continued)

(56) References Cited

U.S. PATENT DOCUMENTS

| | | | | |
|---|---|---|---|---|
| 9,431,517 B2 * | 8/2016 | Chen | .................... | H10D 30/025 |
| 2011/0045648 A1 * | 2/2011 | Knorr | ................ | H10D 30/6211 257/E21.546 |

(Continued)

*Primary Examiner* — Tuan A Hoang
(74) *Attorney, Agent, or Firm* — Crowell & Moring LLP

(57) ABSTRACT

A semiconductor structure and a forming method thereof are provided. In one form, a forming method includes: providing a base, including a device region and a zero mark region; forming a zero mark trench inside the base in the zero mark region; filling the zero mark trench, to form a dielectric layer; forming a fin mask material layer covering the base and the dielectric layer; forming a mandrel layer on the fin mask material layer above the dielectric layer and the base in the device region, where the mandrel layer covers a top portion of the dielectric layer; forming a mask spacer on a side wall of the mandrel layer; removing the mandrel layer; etching the fin mask material layer by using the mask spacer as a mask after the mandrel layer is removed, to form a fin mask layer; and etching a partial thickness of the base using the fin mask layer as a mask, where the remaining base after etching is used as a substrate, and a protrusion located over the substrate in the device region is used as a fin, and etching a partial thickness of the dielectric layer during the etching of the base. In the present disclosure, after a fin is formed by filling a zero mark trench with a dielectric layer, a probability that a residue defect or a peeling defect occurs is relatively low.

7 Claims, 9 Drawing Sheets

(51) Int. Cl.
*H10D 84/01* (2025.01)
*H10D 84/03* (2025.01)

(58) Field of Classification Search
CPC ................ H10D 62/115; H01L 23/544; H01L 2223/54426; H10W 46/00; H10W 46/301
See application file for complete search history.

(56) References Cited

U.S. PATENT DOCUMENTS

| | | | | |
|---|---|---|---|---|
| 2012/0132984 | A1 * | 5/2012 | Mifuji | H01L 21/76831 257/288 |
| 2016/0204197 | A1 | 7/2016 | Liou | |
| 2016/0233241 | A1 * | 8/2016 | Doris | H10D 87/00 |

* cited by examiner

SEMICONDUCTOR STRUCTURE AND FORMING METHOD THEREOF

RELATED APPLICATIONS

The present application is a divisional application of U.S. patent application Ser. No. 17/245,483 (still pending), filed Apr. 30, 2021, which claims priority to Chinese Patent Appln. No. 202011487893.9, filed Dec. 16, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the development trend of very large-scale integration in semiconductor manufacturing, a feature size of an integrated circuit continues to decrease. To adapt to the decrease in feature size, a channel length of a MOSFET also continues to decrease. However, as a channel length of a device becomes smaller, a distance between a source and a drain of the device decreases accordingly. Therefore, a channel control capability of a gate deteriorates, and it becomes increasing difficult for a gate voltage to pinch off a channel, resulting in an increased possibility of subthreshold leakage, that is, the so-called short-channel effect (SCE).

Therefore, to better adapt to the decreased feature size, the semiconductor process is gradually transitioning from a planar MOSFET to a three-dimensional transistor with higher efficacy, for example, a fin field-effect transistor (FinFET). In the FinFET, a gate structure may control an ultra-thin body (a fin) from at least two sides, and compared with the planar MOSFET, the gate structure has a stronger channel control capability, and can suppress the short-channel effect well. Moreover, compared with other devices, the FinFET has better compatibility with manufacturing of the existing integrated circuits.

In addition, as a channel length of a device becomes smaller, a line width size of the device also becomes smaller. If a well implant is performed after a fin is formed, a fin with a relatively small line width size is more likely to be damaged in an ion implant procedure. Therefore, performing a well ion implant on a base before forming a fin gradually becomes a more preferable manner. Correspondingly, in the process, a zero mark trench needs to be formed in the base as an alignment mark for a photolithography process in a procedure of a well ion implant process.

SUMMARY

A problem to be addressed in embodiments and implementations of the present disclosure is to provide a semiconductor structure and a forming method thereof, to enhance performance of a semiconductor structure.

To address the foregoing problems, the present disclosure provide a semiconductor structure. In one form, a semiconductor structure includes: a substrate, including a device region and a zero mark region; a fin, protruding on the substrate in the device region; a zero mark trench, located inside the substrate in the zero mark region, where a top portion of the zero mark trench is flush with a top portion of the substrate; and a dielectric layer, filled in the zero mark trench.

The present disclosure additionally provides a forming method of a semiconductor structure. In one form, a forming method of a semiconductor structure includes: providing a base, including a device region and a zero mark region used for forming a zero mark trench; forming a zero mark trench inside the base in the zero mark region; filling the zero mark trench, to form a dielectric layer located in the zero mark trench; forming a fin mask material layer covering the base and the dielectric layer; forming a mandrel layer on the fin mask material layer above the dielectric layer and the base in the device region, where the mandrel layer covers a top portion of the dielectric layer; forming a mask spacer on a side wall of the mandrel layer; removing the mandrel layer; etching the fin mask material layer using the mask spacer as a mask after the mandrel layer is removed, to form a fin mask layer; and etching a partial thickness of the base using the fin mask layer as a mask, where the remaining base after etching is used as a substrate, and a protrusion located on the substrate in the device region is used as a fin, and etching a partial thickness of the dielectric layer during the etching of the base.

Compared to the prior art, technical solutions of embodiments and implementations of the present disclosure have at least the following advantages:

Embodiments and implementations of the present disclosure provide a semiconductor structure, in which the substrate in the zero mark region is provided with a zero mark trench, a top portion of the zero mark trench is flush with a top portion of the substrate, and the zero mark trench is filled with a dielectric layer, where the zero mark trench is usually formed before a fin is formed. Therefore, by filling the zero mark trench with the dielectric layer to fill a space of the zero mark trench, a probability that a material residue of a fin mask material layer or a mandrel layer is formed on a side wall of the zero mark trench is correspondingly significantly decreased in a process of forming the fin. Correspondingly, after the fin is formed, a probability that the material residue causes a residue defect or a peeling defect is relatively low, thereby helping to enhance performance of the semiconductor structure.

In forms of a forming method provided in the present disclosure, after the zero mark trench is formed in the base in the zero mark region, the zero mark trench is first filled with a dielectric layer, then a fin mask material layer that covers the base and the dielectric layer is formed, and a mandrel layer is formed on the fin mask material layer, where the dielectric layer provides a planar surface for the forming of the fin mask material layer. Compared with a solution in which the fin mask material layer and the mandrel layer are directly formed after the zero mark trench is formed, in embodiments and implementations of the present disclosure, after a mask spacer is formed, a probability that a material residue of the fin mask material layer or the mandrel layer is formed on a side wall of the zero mark trench is significantly decreased. Correspondingly, after the fin is formed, a probability that the material residue causes a residue defect or a peeling defect is relatively low, thereby helping to enhance performance of the semiconductor structure.

DETAILED DESCRIPTION

FIG. 1 to FIG. 10 are schematic structural diagrams corresponding to steps in a forming method of a semiconductor structure.

Figure 1:
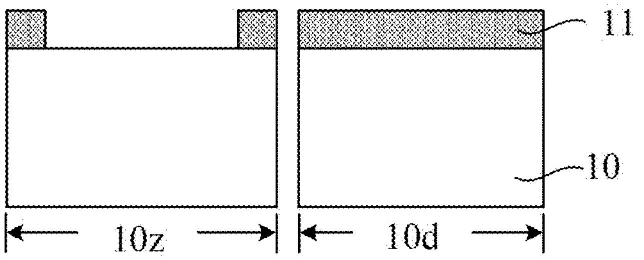
FIG. 1 to FIG. 10 are schematic structural diagrams corresponding to steps in a forming method of a semiconductor structure.

Referring to FIG. 1, a base 10 is provided, including a device region 10*d* and a zero mark region 10*z* used for forming a zero mark trench.

Specifically, the device region 10*d* includes a first device subregion (not marked) used for forming a first-type transistor and a second device subregion (not marked) used for forming a second-type transistor, and channel materials of the first-type transistor and the second-type transistor are different. For example, the material of the base 10 is Si, the first-type transistor is an NMOS transistor, and the second-type transistor is a PMOS transistor.

Still referring to FIG. 1, a first photoresist layer 11 is formed on the base 10, and the first photoresist layer 11 exposes the base 10 in the zero mark region 10*z*.

Figure 2:
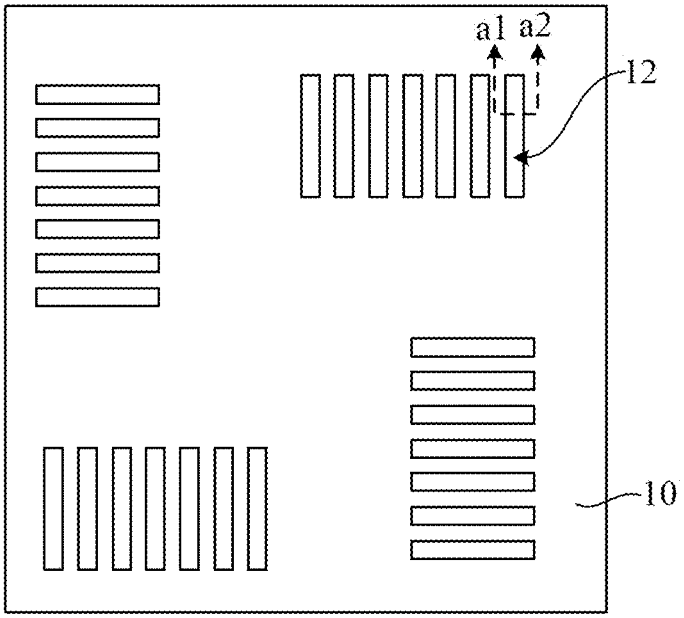
Figure 3:
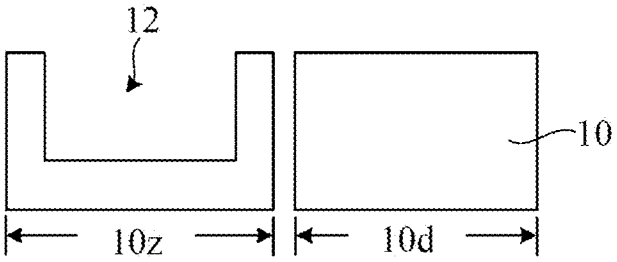

Referring to FIG. 2 and FIG. 3 in combination, where FIG. 2 is a top view, and FIG. 3 is a cross-sectional view of FIG. 2 along a section line a1*a*2, a partial thickness of the base 10 is etched using the first photoresist layer 11 as a mask, to form a zero mark trench 12 in the base 10 in the zero mark region 10*z*.

After the zero mark trench 12 is formed, the forming method further includes: removing the first photoresist layer 11.

It should be noted that, after removing the first photoresist layer 11, some implementations of the forming method further includes: performing a well implant on the base 10 in the device region 10*d*.

Figure 4:
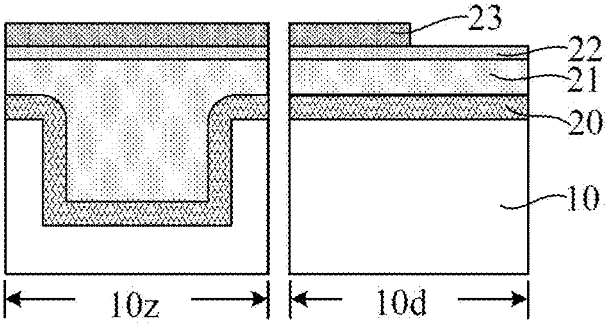

Referring to FIG. 4, a first hard mask material layer 20 conformally covering a bottom portion and a side wall of the zero mark trench 12 and a top portion of the base 10 is formed; and a first mask lamination (not marked) covering the first hard mask material layer 20 is formed. The first mask lamination includes a first planarization layer 21 filling the zero mark trench 12, a first anti-reflective coating 22 located on the first planarization layer 21, and a second photoresist layer 23 located on the first anti-reflective coating 22, and the second photoresist layer 23 exposes the first anti-reflective coating 22 in the second device subregion (not marked).

Figure 5:
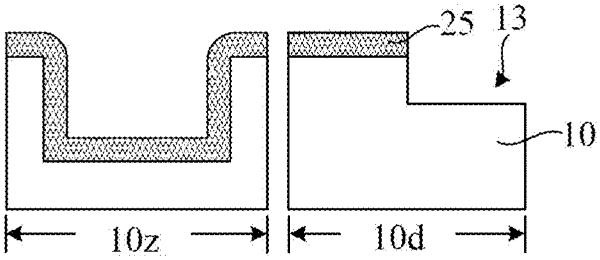

Referring to FIG. 5, the first anti-reflective coating 22, the first planarization layer 21, and the first hard mask material layer 20 are sequentially etched using the second photoresist layer 23 as a mask, and the first hard mask material layer 20 is patterned into a first hard mask layer 25; and a partial thickness of the base 10 is etched using the first hard mask layer 25 as a mask, to form a groove 13 in the base 10 in the second device subregion (not marked).

After the groove 13 is formed, the forming method further includes: removing the remaining first mask lamination (not marked).

Figure 6:
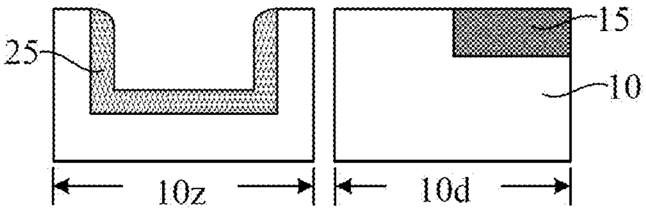

Referring to FIG. 6, a channel material layer (not marked) is epitaxially grown in the groove 13; planarization is performed on the channel material layer, to remove the channel material layer higher than a top surface of the base 10, and form a channel layer 15 located in the groove 13, and the hard mask layer 25 is removed during the planarization.

For example, the second-type transistor is a PMOS transistor, and the material of the channel material layer (that is, the channel layer 15) is SiGe.

Figure 7:
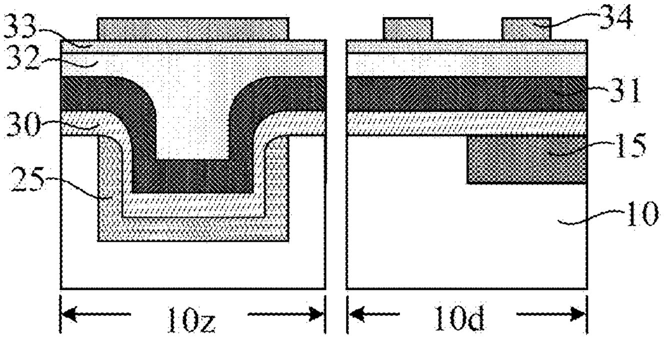

Referring to FIG. 7, a second hard mask material layer 30 conformally covering the base 10, the channel layer 15, and the first hard mask layer 25 and a mandrel material layer 31 conformally covering the second hard mask material layer 30 are formed; and a second mask lamination (not marked) covering the mandrel material layer 31 is formed. The second mask lamination includes a second planarization layer 32 filling the zero mark trench 12, a second anti-reflective coating 33 located on the second planarization layer 32, and a third photoresist layer 34 located on the second anti-reflective coating 33.

In the zero mark region 10*z*, a projection of the third photoresist layer 34 on the base 10 covers a projection of the zero mark trench 12 on the base 10. In the device region 10*d*, the third photoresist layer 34 is located above a partial base 10 in the first device subregion (not marked) and above a partial channel layer 15 in the second device subregion (not marked).

Figure 8:
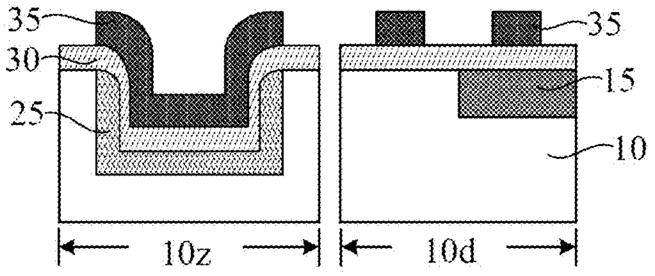

Referring to FIG. 8, the second anti-reflective coating 33, the second planarization layer 32, and the mandrel material layer 31 are sequentially etched using the third photoresist layer 34 as a mask; the mandrel material layer 31 is patterned into a mandrel layer 35; and in the zero mark region 10*z*, the mandrel layer 35 conformally covers the bottom portion and the side wall of the zero mark trench 12, and extends to cover a partial surface of the second hard mask material layer 30 located at a top portion of the base 10.

After the mandrel layer 35 is formed, the forming method further includes: removing the remaining second mask lamination (not marked).

Figure 9:
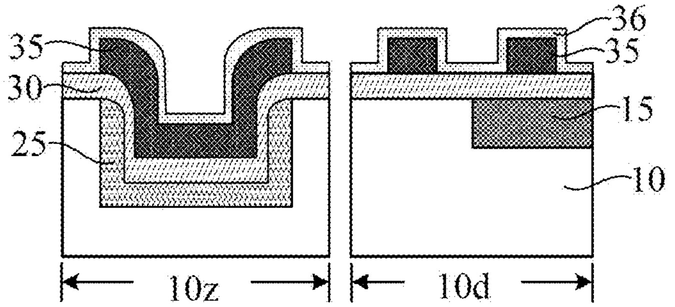

Referring to FIG. 9, a mask spacer material layer 36 conformally covering the mandrel layer 35 and the second hard mask material layer 30 is formed.

Figure 10:
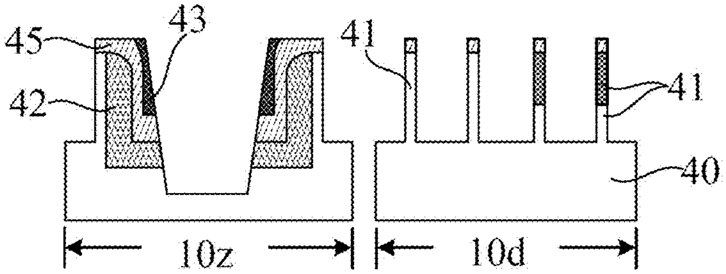

Referring to FIG. 10, anisotropic etching is performed on the mask spacer material layer 36 in a maskless manner, to form a mask spacer (not shown in the figure) located on a side wall of the mandrel layer 35; after the mask spacer is formed, the mandrel layer 35 is removed; after the mandrel layer 35 is removed, the second hard mask material layer 30 is etched using the mask spacer as a mask, to form a second hard mask layer 45; and a partial thickness of the base 10 is etched using the second hard mask layer 45 as a mask, and the channel layer 15 is etched simultaneously, where the remaining base 10 after etching is used as a substrate 40, and a protrusion located on the substrate 40 in the device region 10*d* is used as a fin 41.

When the mandrel layer 35 is removed, the mandrel layer 35 at a bottom portion of the zero mark trench 12 is also removed simultaneously; and when the base 10 is etched, the base 10 at the bottom portion of the zero mark trench 12 is also etched simultaneously. However, because a depth of the zero mark trench 12 is usually relatively large, a residue 45 of the second hard mask material layer 30 and a residue 43 of the mandrel layer 35 are left on the side wall of the zero mark trench 12, resulting in generation of a residue defect.

Moreover, cleaning is performed subsequently, and during the cleaning, the residue 45 of the second hard mask material layer 30 and the residue 43 of the mandrel layer 35 are prone to peel under scouring of a cleaning liquid, resulting in generation of a peeling defect.

To address the technical problem, the present disclosure provides a forming method of a semiconductor structure. In one form, a forming method of a semiconductor structure includes: providing a base, including a device region and a zero mark region used for forming a zero mark trench; forming a zero mark trench inside the base in the zero mark region; filling the zero mark trench, to form a dielectric layer located in the zero mark trench; forming a fin mask material layer covering the base and the dielectric layer; forming a mandrel layer on the fin mask material layer above the dielectric layer and the base in the device region, where the mandrel layer covers a top portion of the dielectric layer; forming a mask spacer on a side wall of the mandrel layer; removing the mandrel layer; etching the fin mask material layer by using the mask spacer as a mask after the mandrel layer is removed, to form a fin mask layer; and etching a partial thickness of the base using the fin mask layer as a mask, where the remaining base after etching is used as a substrate, and a protrusion located on the substrate in the device region is used as a fin, and etching a partial thickness of the dielectric layer during the etching of the base.

In implementations of the forming method of a semiconductor structure provided in the present disclosure, after the zero mark trench is formed in the base in the zero mark region, the zero mark trench is first filled with the dielectric layer, then the fin mask material layer that covers the base and the dielectric layer is formed, and the mandrel layer is formed on the fin mask material layer, where the dielectric layer provides a planar surface for the forming of the fin mask material layer. Compared with a solution in which the fin mask material layer and the mandrel layer are directly formed after the zero mark trench is formed, in some implementations, after a mask spacer is formed, a probability that a material residue of the fin mask material layer or the mandrel layer is formed on a side wall of the zero mark trench is significantly decreased. Correspondingly, after the fin is formed, a probability that the material residue causes a residue defect or a peeling defect is relatively low, thereby helping to enhance performance of the semiconductor structure.

To make the above objects, features, and advantages of the present disclosure more comprehensible, specific embodiments and implementations of the present disclosure are described in detail below with reference to the accompanying drawings.

Figure 11:
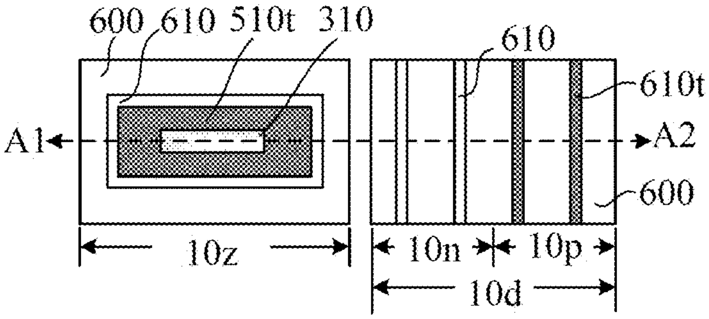
FIG. 11 is top view of one form of a semiconductor structure according to the present disclosure.
Figure 12:
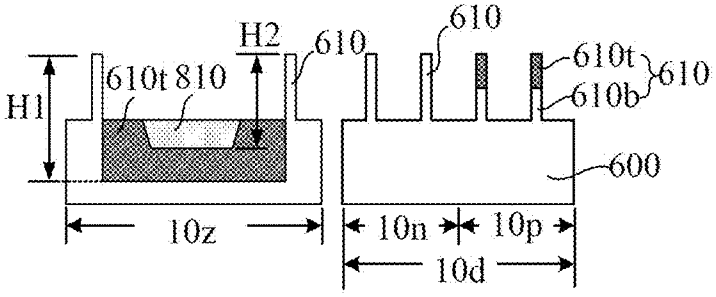
FIG. 12 is a cross-sectional view of FIG. 11 along a section line A1A2.

Referring to FIG. 11 and FIG. 12 in combination, FIG. 11 is top view of one form of a semiconductor structure according to the present disclosure, and FIG. 12 is a cross-sectional view of FIG. 11 along a section line A1A2.

The semiconductor structure includes: a substrate 600, including a device region 10*d* and a zero mark region 10*z*; a fin 610, protruding on the substrate 600 in the device region 10*d*; a zero mark trench (not marked), located inside the substrate 600 in the zero mark region 10*z*, where a top portion of the zero mark trench is flush with a top portion of the substrate 600; and a dielectric layer 810, filled in the zero mark trench.

The zero mark trench is usually formed before the fin 610 is formed. Therefore, the zero mark trench is filled with the dielectric layer 810, to fill a space in the zero mark trench, and the fin 610 is usually formed using a self-aligned multi patterning (SAMP) process. For example, the fin 610 is formed using a self-aligned double patterning (SADP) process. Therefore, by filling the zero mark trench with the dielectric layer 810, a probability that a material residue of the fin mask material layer or the mandrel layer is formed on a side wall of the zero mark trench is significantly decreased in a forming process of the fin 610. Correspondingly, after the fin 610 is formed, a probability that the material residue causes a residue defect or a peeling defect is relatively low, thereby helping to enhance performance of the semiconductor structure.

In this form, the substrate 600 is a bulk substrate. Specifically, the material of the substrate 600 is silicon. In other forms, the substrate may alternatively be made of another material such as germanium, silicon germanium, silicon carbide, gallium arsenide, or indium gallium, and the substrate may alternatively be another type of substrate such as a silicon substrate on an insulator or a germanium substrate on an insulator.

The substrate 600 includes a device region 10*d* used for forming a fin field effect transistor.

In this form, the device region 10*d* includes a first device subregion 10*p* used for forming a first-type transistor and a second device subregion 10*n* used for forming a second-type transistor, where channel materials of the first-type transistor and the second-type transistor are different. Different channel materials are used to meet respective performance requirements of the first-type transistor and the second-type transistor.

Specifically, channel conductivity types of the first-type transistor and the second-type transistor are different, where the channel conductivity type include an N type or a P type. For example, the first-type transistor is a PMOS transistor, and the second-type transistor is an NMOS transistor. In other forms, according to the performance requirements of the transistors, even if the channel conductivity types of the first-type transistor and the second-type transistor are the same, the first-type transistor and the second-type transistor may be made of different channel materials.

The fin 610 protrudes on the substrate 600 in the device region 10*d*, and the fin 610 is configured to provide a channel of the fin field effect transistor. For example, in the first device subregion 10*p*, the fin 610 includes a bottom fin layer 610*b* and a channel layer 610*t* located at a top portion of the bottom fin layer 610*b*, and the material of the channel layer 610*t* is different from the material of the bottom fin layer 610*b*.

Correspondingly, in the second device subregion 10*n*, the fin 610 is used to provide the channel of the fin field effect transistor; and in the first device subregion 10*p*, the channel layer 610*t* is used to provide the channel of the fin field effect transistor.

Specifically, the fin 610 and the bottom fin layer 610*b* in the second device subregion 10*n* and the substrate 600 are an integral structure, and both materials of the fin 610 and the bottom fin layer 610*b* in the second device subregion 10*n* are silicon.

The channel layer 610*t* is also configured to provide the channel of the fin field effect transistor. Therefore, the material of the channel layer 610*t* is a semiconductor material. Specifically, the material of the channel layer 610*t* includes silicon, silicon germanium, germanium, or a III-V group semiconductor material.

In this form, the first-type transistor is a PMOS transistor, and the second-type transistor is an NMOS transistor. Therefore, the material of the channel layer 610*t* is silicon germanium. A channel mobility of the PMOS transistor is improved by making the PMOS transistor use a channel made of a silicon germanium material, which also helps to alleviate a negative bias temperature instability (NBTI) problem of the PMOS transistor, thereby enhancing performance of the PMOS transistor.

It should be noted that, in other forms, according to an actual situation, alternatively, the fin in the second device subregion includes a bottom fin layer and a channel layer located at a top portion of the bottom fin layer; and the fin in the first device subregion, the bottom fin layer, and the substrate are an integral structure.

In this form, the fin 610 is further located in the zero mark region 10*z*, and surrounds the zero mark trench. The fin 610 in the zero mark region 10*z* and the substrate 600 are of an integral structure. The fin 610 in the zero mark region 10*z* is formed when the fin 610 in the device region 10*d* is formed. The fin 610 in the zero mark region 10*z* is a dummy fin, and the fin 610 in the zero mark region 10*z* is not used for forming a transistor. In other forms, in the forming process of the semiconductor structure, the fin in the zero mark region may alternatively be removed in a fincut manner. Correspondingly, in the semiconductor structure, there may alternatively be no fin around the zero mark trench.

The zero mark trench is located inside the substrate 600 in the zero mark region 10*z*.

In the forming process of the semiconductor structure, the substrate 600 and the fin 610 are formed by patterning the base, and before the fin 610 is formed, the zero mark trench is formed in the base, where the zero mark trench is used as an alignment mark for a photolithography process. For example, in a process of performing a well ion implant on the base or a process of forming the fin, the zero mark trench is used as an alignment mark. In the processes of performing a well ion implant and forming the fin, no other pattern has been formed on the base yet, so that the zero mark trench needs to be formed first as an alignment mark.

In this form, in the forming process of the semiconductor structure, a related process for forming the fin 610 is performed after the zero mark trench is filled with the dielectric layer 810. Correspondingly, when a partial thickness of the base is etched to form the fin 610, the dielectric layer 810 is usually etched. Therefore, the top portion of the zero mark trench is flush with the top portion of the substrate 600.

It should be noted that, a distance H1 between a bottom portion of the zero mark trench and a top portion of the fin 610 is a distance between the bottom portion of the zero mark trench and the base before the fin 610 is formed, that is, a depth of the zero mark trench before the fin 610 is formed. In addition, in a photolithography process of performing a well ion implant on the base, alignment is implemented by using a signal phase difference between a top portion of the base and the bottom portion of the zero mark trench. Therefore, the distance H1 between the bottom portion of the zero mark trench and the top portion of the fin 610 affects signal strength during photolithography alignment, and consequently, affects alignment accuracy.

Therefore, the distance H1 between the bottom portion of the zero mark trench and the top portion of the fin 610 should be neither excessively small nor excessively large.

That the distance H1 is either excessively or excessively small may result in relatively weak signal strength, and consequently, alignment accuracy degrades, and an alignment deviation occurs.

Moreover, in the forming process of the semiconductor structure, after a dielectric material corresponding to the dielectric layer 810 is filled into the zero mark trench, planarization (for example, chemical mechanical polishing processing) further needs to be performed on the dielectric material. If the distance H1 is excessively large, a filling amount of the dielectric material corresponding to the dielectric layer 810 will be excessively large, and a polishing amount of planarization is correspondingly relatively large, which is prone to cause a top surface depression problem to the dielectric layer 810.

In addition, if the distance H1 is excessively large, the depth of the zero mark trench is also excessively large, which is prone to cause degraded stability of the etching process of forming the zero mark trench and the process of filling the zero mark trench with the dielectric material, and correspondingly affects the signal strength during photolithography alignment, resulting in an alignment deviation.

With reference to the several aspects described above, in this form, the distance H1 between the bottom portion of the zero mark trench and the top portion of the fin 610 is from 600 Å to 1500 Å. For example, the distance H1 between the bottom portion of the zero mark trench and the top portion of the fin 610 is 700 Å, 900 Å, 1100 Å, or 1400 Å.

In this form, the channel layer 610*t* is further located at the bottom portion of and on the side wall of the zero mark trench.

In the forming process of the semiconductor structure, after the dielectric material corresponding to the dielectric layer 810 is filled into the zero mark trench, planarization further needs to be performed, so that a top portion of the dielectric layer 810 is flush with the top portion of the base. The channel layer 610*t* occupies a partial space of the zero mark trench, to reduce an opening size of the remaining space of the zero mark trench, and correspondingly reduce a filling amount of the dielectric material corresponding to the dielectric layer 810, thereby helping to alleviate the top surface depression problem of the dielectric layer 810 after planarization is performed on the dielectric material corresponding to the dielectric layer 810.

The dielectric layer 810 is filled into the zero mark trench, and the material of the dielectric layer 810 is a dielectric material. In a procedure of a photolithography process of using the zero mark trench as an alignment mark, it is easy to obtain a signal from the bottom portion of the zero mark trench through the dielectric layer 810, to reduce impact on the signal strength during photolithography alignment. For example, the fin 610 is usually formed by using a SAMP process, and in a procedure of a photolithography process of forming the mandrel layer, the zero mark trench is used as an alignment mark.

In this form, the channel layer 610*t* is correspondingly located between the side wall of the zero mark trench and the dielectric layer 810, and between the bottom portion of the zero mark trench and the dielectric layer 810.

Specifically, the dielectric layer 810 includes one or more of silicon nitride (SiN), silicon oxide ($SiO_2$), silicon oxycarbide (SiOC), silicon oxynitride (SiON), and silicon oxycarbonitride (SiOCN). The materials above have relatively small impact on signal strength.

In this form, the material of the dielectric layer 810 is silicon nitride.

In the forming process of the semiconductor structure, after the dielectric material corresponding to the dielectric layer 810 is filled into the zero mark trench, the dielectric material further covers a surface of a channel material layer corresponding to the channel layer 610*t*. Density of silicon nitride is relatively high. Therefore, selection of silicon nitride helps to improve an anti-oxidation effect of the dielectric material on the channel material layer, thereby improving quality of the channel layer 610*t*.

It should be noted that, a distance H2 between a bottom portion of the dielectric layer 810 and the top portion of the fin 610 is a thickness of the dielectric layer 810 before the fin is formed, and the distance H2 between the bottom portion of the dielectric layer 810 and the top portion of the fin 610 should be neither excessively small nor excessively large.

If the distance H2 between the bottom portion of the dielectric layer 810 and the top portion of the fin 610 is excessively small, when the thickness of the channel layer 610*t* in the zero mark trench is fixed, to enable the dielectric layer 810 to fill up the zero mark trench, the distance H1 between the bottom portion of the zero mark trench and the top portion of the fin 610 is correspondingly excessively small, which is prone to attenuate the signal strength during photolithography alignment. Alternatively, in a case that the depth of the zero mark trench is fixed, the thickness of the channel layer 610*t* in the zero mark trench correspondingly needs to be increased. The material of the channel layer 610*t* is close to the material of the base 100. When a signal is obtained, it is easy to mistakenly consider a top portion of the channel material layer located at the bottom portion of the zero mark trench as the bottom portion of the zero mark trench, which also correspondingly attenuates the signal strength during photolithography alignment.

If the distance H2 between the bottom portion of the dielectric layer 810 and the top portion of the fin 610 is excessively large, in the forming process of the semiconductor structure, a filling amount of the dielectric material corresponding to the dielectric layer 810 in the zero mark trench is relatively large. After planarization is performed on the dielectric material corresponding to the dielectric layer 810, a probability that the top surface depression problem occurs on the dielectric layer 810 becomes higher.

Based on the above, in this form, the distance H2 between the bottom portion of the dielectric layer 810 and the top portion of the fin 610 is from 100 Å to 1000 Å. For example, the distance H2 between the bottom portion of the dielectric layer 810 and the top portion of the fin 610 is 300 Å, 500 Å, 700 Å, or 900 Å.

In this form, the semiconductor structure further includes: a well (not shown), located on the substrate 600 and in the fin 610 that is, together with the substrate 600, an integral structure.

The well is used for providing an N-type base or a P-type base required for working for a corresponding transistor, and implementing electrical isolation between neighboring transistors.

There are well ions in the well, and a conductivity type of the well ions is opposite to a channel conductivity type of the corresponding transistor. That is, well ions in a well corresponding an NMOS transistor are P-type ions, and well ions in a well corresponding a PMOS transistor are N-type ions.

Correspondingly, one form of the present disclosure further provides a forming method of a semiconductor structure.

FIG. 13 to FIG. 33 are schematic structural diagrams corresponding to steps in one form of a forming method of a semiconductor structure according to the present disclosure.

Figure 13:
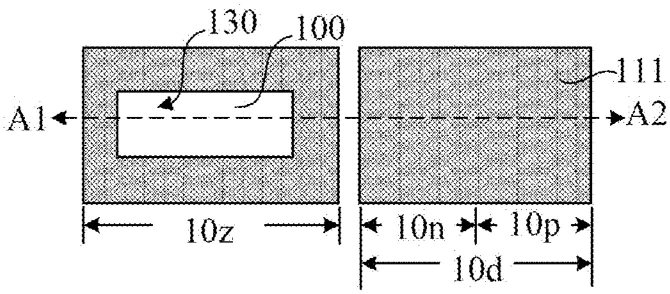
FIG. 13 to FIG. 33 are schematic structural diagrams corresponding to steps in one form of a forming method of a semiconductor structure according to the present disclosure.
Figure 14:
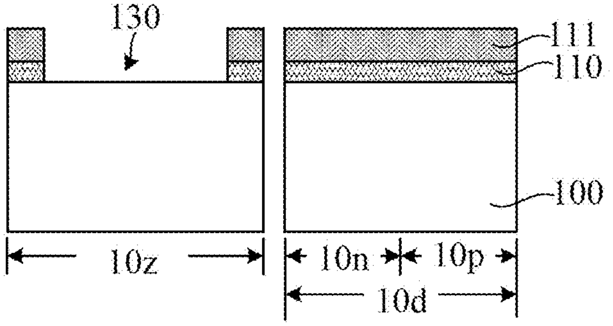

Referring to FIG. 13 and FIG. 14, where FIG. 13 is a top view, and FIG. 14 is a cross-sectional view of FIG. 13 along a section line A1A2, a base 100 is provided, including a device region 10*d* and a zero mark region 10*z* used for forming a zero mark trench.

The base 100 is used for providing a process platform for forming the semiconductor structure.

In this form, the base 100 is a bulk substrate. Specifically, the material of the base 100 is silicon. In other forms, the base may alternatively be made of another material such as germanium, silicon germanium, silicon carbide, gallium arsenide, or indium gallium, and the base may alternatively be another type of substrate such as a silicon substrate on an insulator or a germanium substrate on an insulator.

In this form, the base 100 includes a device region 10*d* used for forming a fin field effect transistor.

In this form, the device region 10*d* includes a first device subregion 10*p* used for forming a first-type transistor and a second device subregion 10*n* used for forming a second-type transistor, and channel materials of the first-type transistor and the second-type transistor are different; Different channel materials are used to meet respective performance requirements of the first-type transistor and the second-type transistor.

Specifically, channel conductivity types of the first-type transistor and the second-type transistor are different, where the channel conductivity type include an N type or a P type.

For example, the first-type transistor is a PMOS transistor, and the second-type transistor is an NMOS transistor. In other forms, according to the performance requirements of the transistors, even if the channel conductivity types of the first-type transistor and the second-type transistor are the same, the first-type transistor and the second-type transistor may be made of different channel materials.

Still referring to FIG. 13 and FIG. 14, the forming method further includes: forming a hard mask layer 110 on the base 100; and forming a first mask opening 130 in the hard mask layer 110, where a side wall of the first mask opening 130 is flush with a side wall of the zero mark trench. The first mask opening 130 is used for defining an opening size and a position of the zero mark trench subsequently.

Specifically, the step of forming the first mask opening 130 includes: forming a first photoresist layer 111 on the hard mask layer 110, where the first photoresist layer 111 exposes the hard mask layer 110 at a position in which the zero mark trench is to be formed; and etching the hard mask layer 110 using the first photoresist layer 111 as a mask, to from the first mask opening 130 running through the hard mask layer 110.

In this form, after the first mask opening 130 is formed, the first photoresist layer 111 may be retained, so that in a subsequent process of forming the zero mark trench, the first photoresist layer 111 and the hard mask layer 110 jointly function as an etching mask. In other forms, the first photoresist layer may alternatively be removed.

The material of the hard mask layer 110 may include one or more of amorphous carbon (a-C), silicon oxide ($SiO_2$), silicon nitride (SiN), silicon oxycarbide (SiOC), and titanium nitride (TiN). In this form, the material of the hard mask layer 110 is silicon oxide.

Figure 15:
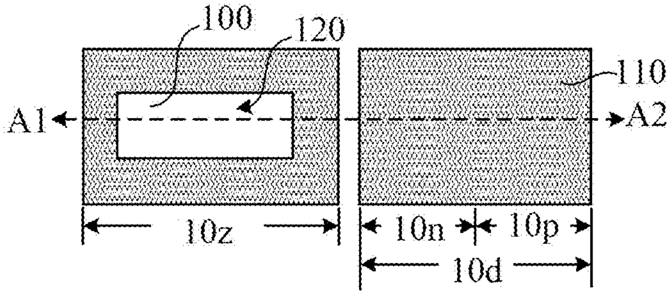
Figure 16:
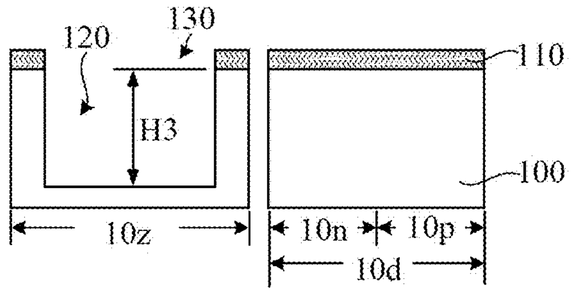

Referring to FIG. 15 and FIG. 16 in combination, where FIG. 15 is a top view based on FIG. 13, and FIG. 16 is a cross-sectional view of FIG. 15 along a section line A1A2, a zero mark trench 120 (shown in FIG. 16) is formed inside the base 100 in the zero mark region 10*z*.

A subsequent process further includes: performing a well ion implant on the base 100 in the device region 10*d*, and patterning the base 100 to form a fin, where the zero mark trench 120 is used as an alignment mark for a photolithography process in the processes of performing a well ion implant and forming the fin.

In this form, after the first mask opening 130 is formed, the zero mark trench 120 is formed.

Specifically, a partial thickness of the base 100 is etched along the first mask opening 130 using the hard mask layer 110 as a mask, to form the zero mark trench 120.

For example, a partial thickness of the base 100 is etched using an anisotropic dry etching process, to form the zero mark trench 120. The anisotropic dry etching process has characteristics of anisotropic etching. A longitudinal etching rate of the etching process is higher than a lateral etching rate thereof, thereby helping to improve the profile quality of a side wall of the zero mark trench 120. In addition, controllability of the anisotropic dry etching process is relatively high, thereby helping to accurately control a depth H3 (shown in FIG. 16) of the zero mark trench 120.

It should be noted that, subsequently, during a well ion implant and in a photolithography process of forming the fin, alignment is implemented using a signal phase difference between a top portion of the base 100 and a bottom portion of the zero mark trench 120. Therefore, the depth H3 of the zero mark trench 120 affects signal strength during photolithography alignment, thereby affecting alignment accuracy.

Therefore, the depth H3 of the zero mark trench 120 should be neither excessively small nor excessively large.

That the depth H3 of the zero mark trench 120 is excessively large or excessively small may result in relatively weak signal strength, and consequently, alignment accuracy degrades, and an alignment deviation occurs.

Moreover, a dielectric layer is further filled into the zero mark trench 120 subsequently, and after a dielectric material corresponding to the dielectric layer is filled into the zero mark trench 120, planarization further needs to be performed on the dielectric material. If the depth H3 of the zero mark trench 120 is excessively large, a filling amount of the dielectric material will be excessively large, and a polishing amount of planarization is correspondingly relatively large, which is prone to cause a top surface depression problem of the dielectric layer.

In addition, when the depth H3 of the zero mark trench 120 is excessively large, stability of the etching process of forming the zero mark trench 120 and the process of filling the zero mark trench 120 with the dielectric material subsequently is prone to degrade, which correspondingly affects the signal strength during photolithography alignment, and consequently causes alignment deviation.

With reference to the several aspects described above, in this form, the depth H3 of the zero mark trench 120 is from 600 Å to 1500 Å. For example, the depth H3 of the zero mark trench 120 is 700 Å, 900 Å, 1100 Å, or 1400 Å.

It should be further noted that, in a process of etching the base 100 to form the zero mark trench 120, the first photoresist layer 111 can be easily removed. After the zero mark trench 120 is formed, when a partial thickness of the first photoresist layer 111 still remains, the forming method correspondingly further includes: removing the remaining first photoresist layer 111, to prepare for a subsequent process.

In this form, after the first photoresist layer 111 is removed, the forming method further includes: performing a well implant on the base 100 in the device region 10*d*, to form a well (not shown).

The well is used for providing an N-type base or a P-type base required for working for a corresponding transistor, and implementing electrical isolation between neighboring transistors. There are well ions in the well, and a conductivity type of the well ions is opposite to a channel conductivity type of the corresponding transistor. That is, well ions in a well corresponding an NMOS transistor are P-type ions, and well ions in a well corresponding a PMOS transistor are N-type ions.

In this form, channel conductivity types of the first-type transistor and the second-type transistor are different, so that well ions in wells in the first device subregion 10*p* and the second device subregion 10*n* have different conductivity types. For example, the first-type transistor is a PMOS transistor, and the second-type transistor is an NMOS transistor. Therefore, well ions formed in a well in the first device subregion 10*p* are N-type ions, and well ions formed in a well in the second device subregion 10*n* are P-type ions.

Specifically, by using a well ion implant process, the base 100 in the first device subregion 10*p* and the base 100 in the second device subregion 10*n* are respectively implanted with ions having corresponding conductivity types.

It should be noted that, the forming method is used for forming a fin field effect transistor, that is, forming a fin subsequently by patterning the base 100. With continuous reduction of a critical size of a device, a line width size of a fin becomes smaller, and if a well ion implant is performed on a fin after the fin is formed, the fin is prone to be damaged. Therefore, in this form, a well ion implant is performed before a fin is formed, thereby preventing a process of forming a well from damaging the fin.

Referring to FIG. 17 to FIG. 20 in combination, the forming method further includes: forming a second mask opening 140 (shown in FIG. 20) in the hard mask layer 110, where the second mask opening 140 is located above the base 100 in the first device subregion 10*p*.

In this form, after the zero mark trench 120 is formed, the hard mask layer 110 in the first device subregion 10*p* is removed, to form the second mask opening 140. Specifically, after the well (not shown) is formed, the second mask opening 140 is formed.

The second mask opening 140 is used for defining an opening size and a position of a groove subsequently formed in the base 100.

Figure 17:
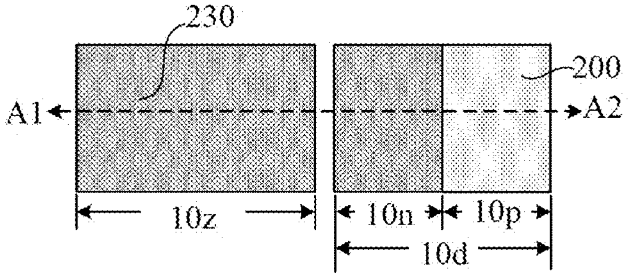
Figure 18:
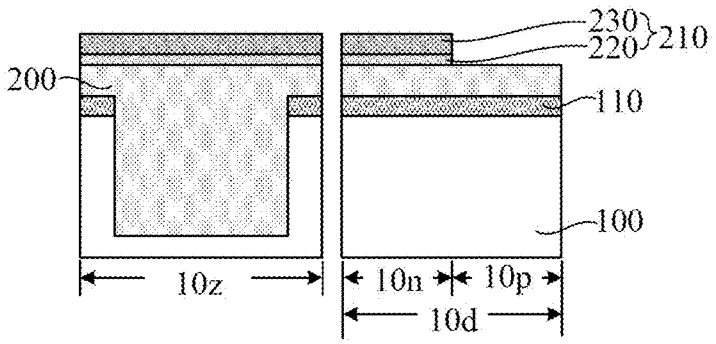

Referring to FIG. 17 and FIG. 18 in combination, where FIG. 17 is a top view based on FIG. 15, and FIG. 18 is a cross-sectional view of FIG. 17 along a section line A1A2, in this form, before the second mask opening 140 is formed, the forming method further includes: forming a planarization layer 200 that is filled in the zero mark trench 120 (shown in FIG. 16) and that covers a top portion of the hard mask layer 110; and forming a pattern layer 210 having a pattern opening (not marked) on the planarization layer 200, where the pattern opening is located above the base 100 in the first device subregion 10*p*.

The pattern layer 210 is used as a mask for subsequently etching the hard mask layer 110 in the first device subregion 10*p*.

The planarization layer 200 is used for providing a planar surface for forming the pattern layer 210, to improve exposure uniformity, thereby improving size accuracy and profile quality of the pattern opening. For example, the material of the planarization layer 200 is a spin on carbon (SOC) material.

The pattern layer 210 includes an anti-reflective coating 220 and a second photoresist layer 230 located on the anti-reflective coating 220. In a procedure of a photolithography process of forming the second photoresist layer 230, the anti-reflective coating 220 is used for increasing the exposure depth of field (DOF) in a procedure of the photolithography process, which helps to improve exposure uniformity.

In this form, the material of the anti-reflective coating 220 is a silicon-based anti-reflective coating (Si-ARC) material. The Si-ARC layer is rich in silicon, and therefore, further helps to increase hardness of the anti-reflective coating 220, thereby helping to further improve the precision of pattern transfer.

Specifically, after the second photoresist layer 230 is formed through steps such as coating, exposure, and development, the anti-reflective coating 220 is etched by using the second photoresist layer 230 as a mask, to form the pattern layer 210 of a laminated structure, and form the pattern opening in the pattern layer 210.

Figure 19:
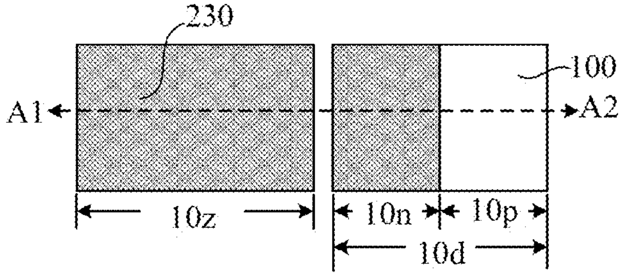
Figure 20:
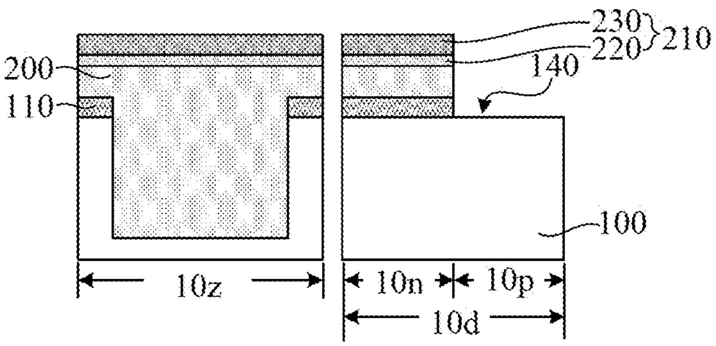

Referring to FIG. 19 and FIG. 20 in combination, where FIG. 19 is a top view based on FIG. 17, and FIG. 20 is a cross-sectional view of FIG. 19 along a section line A1A2. In this form, after the pattern layer 210 having the pattern opening (not marked) is formed, and before the second mask opening 140 is formed, the forming method further includes: removing, using the pattern layer 210 as a mask, the planarization layer 200 exposed by the pattern opening, to expose the hard mask layer 110 located above the base 100 in the first device subregion 10*p*.

The hard mask layer 110 located above the base 100 in the first device subregion 10*p* is exposed, to prepare for subsequently etching the exposed hard mask layer 110.

Therefore, still referring to FIG. 19 and FIG. 20, the step of forming the second mask opening 140 correspondingly includes: removing the hard mask layer 110 exposed by the remaining planarization layer 200 after the planarization layer 200 exposed by the pattern opening is removed.

In this form, after the patterned second photoresist layer 230 is formed, the anti-reflective coating 220, the planarization layer 200, and the hard mask layer 110 are sequentially etched using an anisotropic dry etching process, to accurately implement pattern transfer, thereby improving size accuracy and profile quality of the second mask opening 140.

Figure 21:
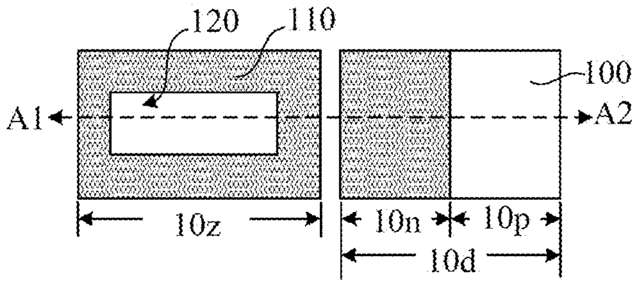
Figure 22:
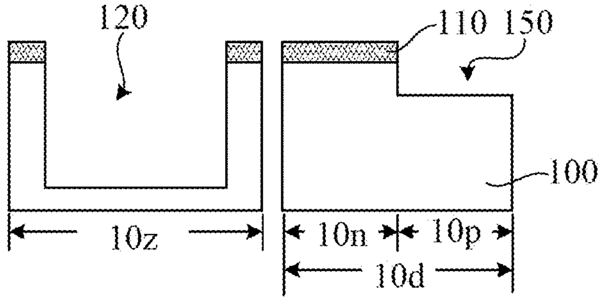

Referring to FIG. 21 and FIG. 22, where FIG. 21 is a top view based on FIG. 19, and FIG. 22 is a cross-sectional view of FIG. 21 along a section line A1A2, in the first device subregion 10*p*, a partial thickness of the base 100 is removed, to form a groove 150 (shown in FIG. 24) in the base 100, and a depth of the groove 150 is less than the depth H3 (shown in FIG. 16) of the zero mark trench 120.

The groove 150 is used for providing a spatial position for subsequently forming a channel material layer.

The partial thickness of the base 100 is etched subsequently, and the channel material layer is etched simultaneously, to form the fin. In this form, in the first device subregion 10*p*, the remaining channel material layer is etched to form the fin, and the remaining channel material layer after etching is used for providing a channel of the first-type transistor.

To improve the signal strength during photolithography alignment, the depth H3 of the zero mark trench 120 is usually relatively large. Therefore, the depth of the groove 150 is less than the depth H3 of the zero mark trench 120.

Specifically, the step of forming the groove 150 includes: etching the partial thickness of the base 100 along the second mask opening 140 (shown in FIG. 20) by using the hard mask layer 110 as a mask.

In this form, the partial thickness of the base 100 is etched using an anisotropic dry etching process, to form the groove 150, thereby improving profile quality of a side wall of the groove 150 while helping to accurately control the depth of the groove 150.

In this form, after the groove 150 is formed, the remaining pattern layer 210 and the remaining planarization layer 200 are removed. In the process of etching the base 100 to form the groove 150, the planarization layer 200 protects the bottom portion and the side wall of the zero mark trench 120, thereby reducing impact on a size and a profile of the zero mark trench 120. In addition, the remaining pattern layer 210 and the remaining planarization layer 200 are removed, to prepare for subsequently forming the channel material layer in the groove 150.

It should be noted that, this form provides a description by using an example in which the groove 150 is formed in the base 100 in the first device subregion 10*p*. In other forms, according to an actual situation, the groove may alternatively be formed in the base in the second device subregion. Correspondingly, the pattern opening is located above the base in the second device subregion, and the second mask opening is located above the base in the second device subregion. A specific process is similar to the process of forming the groove in the first device subregion, and details are not described herein again.

It should be further noted that, in other forms, alternatively, a hard mask layer having a first mask opening and a second mask opening may be formed after a zero mark trench is formed in the base in the zero mark region, and then a groove is formed. For example, the forming method may include: filling up, after a zero mark trench is formed, the zero mark trench with a sacrificial layer; forming a hard mask layer covering the base and the sacrificial layer after the sacrificial layer is formed; forming a first mask opening and a second mask opening in the hard mask layer; etching a partial thickness of the base along the second mask opening by using the hard mask layer as a mask, to form a groove in the base; and removing the sacrificial layer along the first mask opening after the groove is formed.

The zero mark trench is occupied using the sacrificial layer, to prevent the hard mask layer from further covering the bottom portion and the side wall of the zero mark trench. Correspondingly, after the sacrificial layer is removed subsequently, the material of the base at the bottom portion of and on the side wall of the zero mark trench is exposed. In addition, the zero mark trench is filled with the sacrificial layer. Therefore, in a process of etching a partial thickness of the base, the sacrificial layer can protect the side wall and the bottom portion of the zero mark trench.

Specifically, the material of the sacrificial layer may be an organic material, for example, an organic dielectric layer (ODL) material or a deep UV light absorbing oxide (DUO) material.

Figure 23:
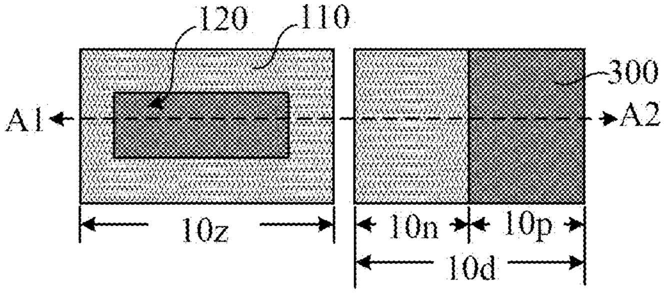
Figure 24:
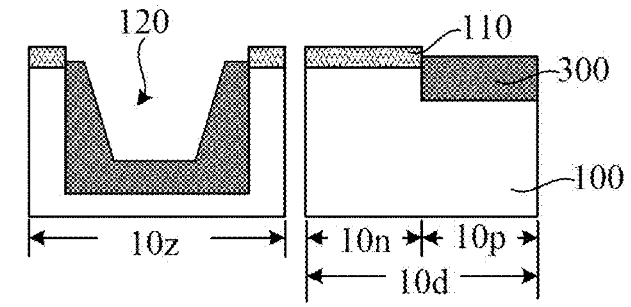

Referring to FIG. 23 and FIG. 24 in combination, where FIG. 23 is a top view based on FIG. 21, and FIG. 24 is a cross-sectional view of FIG. 23 along a section line A1A2, after the zero mark trench 120 and the groove 150 are formed, a channel material layer 300 is epitaxially grown in the zero mark trench 120 and the groove 150.

In the device region 10*d*, the channel material layer 300 is used for providing a channel of the fin field effect transistor. Specifically, the groove 150 is formed in the base 100 in the first device subregion 10*p*. Therefore, the channel material layer 300 is used for providing a channel of the first-type transistor. Similarly, in other forms, when the groove is formed in the base in the second device subregion, the channel material layer is correspondingly used for providing a channel of the second-type transistor.

Therefore, the material of the channel material layer 300 is a channel material that can be used by a transistor. Specifically, the material of the channel material layer 300 includes silicon, silicon germanium, germanium, or a III-V group semiconductor material.

In this form, channel materials of the first-type transistor and the second-type transistor are different. Therefore, materials of the channel material layer 300 and the base 100 are different.

Specifically, the groove 150 is formed in the base 100 in the first device subregion 10*p*, and the first-type transistor is a PMOS transistor. Therefore, in this form, the material of the channel material layer 300 is silicon germanium. A channel made of a silicon germanium material is adopted for the PMOS transistor, to improve a channel mobility of the PMOS transistor while helping to alleviate an NBTI problem of the PMOS transistor, thereby enhancing performance of the PMOS transistor.

In this form, the channel material layer 300 is formed using an epitaxial growth process, so that formation quality of the channel material layer 300 is relatively good.

It should be noted that, in this form, before the groove 150 is formed, the hard mask layer 110 is formed first, and the first mask opening 130 is formed in the hard mask layer 110. In addition, the first mask opening 130 is in communication with the zero mark trench 120, so that the material of the base 100 at the bottom portion of and on the side wall of the zero mark trench 120 is exposed. Therefore, in the process of epitaxially growing the channel material layer 300 in the groove 150, the bottom portion and the side wall of the zero mark trench 120 may further be used as a foundation of epitaxial growth, so that the channel material layer 300 is further formed at the bottom portion of and on the side wall of the zero mark trench 120.

It should be further noted that, in this form, the base in the zero mark region 10*z* is etched along the first mask opening 130 using the hard mask layer 110 as a mask, to form the zero mark trench 120, so that a side wall of the first mask opening 130 is flush with the side wall of the zero mark trench 120, and the first mask opening 130 is correspondingly aligned with the zero mark trench 120, thereby easily making the material of the base 100 at the bottom portion of and on the side wall of the zero mark trench 120 exposed.

In addition, because the depth of the groove 150 is less than the depth H3 (shown in FIG. 16) of the zero mark trench 120, after the channel material layer 300 is epitaxially grown in the groove 150, the zero mark trench 120 is not fully filled with the channel material layer 300, and the channel material layer 300 conformally covers the bottom portion and the side wall of the zero mark trench 120, thereby providing a spatial position for subsequently forming a dielectric layer in the zero mark trench 120.

In this form, the hard mask layer 110 is formed on the base 100 surrounding the zero mark trench 120 and the groove 150. Therefore, the hard mask layer 110 protects the top portion of the base 100, and the base 100 surrounding the zero mark trench 120 and the groove 150 is not exposed in an epitaxial growth environment in which the channel material layer 300 is formed, so that the channel material layer 300 is only formed in the zero mark trench 120 and the groove 150.

Correspondingly, in this form, the channel material layer 300 is epitaxially grown in the zero mark trench 120 exposed by the first mask opening 130 and the groove 150 exposed by the second mask opening 140.

In this form, in the step of epitaxially growing the channel material layer 300 in the groove 150, a top portion of the channel material layer 300 in the groove 150 is higher than the top portion of the base 100.

The top portion of the channel material layer 300 in the groove 150 is higher than the top portion of the base 100, to prepare for planarization subsequently performed on the channel material layer 300 in the groove 150, thereby improving flatness of a top surface of the remaining channel material layer 300 in the groove 150 and the top surface of the base 100 after the planarization, and facilitating simultaneously etching the base 100 and the channel material layer 300 subsequently.

For example, the top portion of the channel material layer 300 in the groove 150 is lower than a top surface of the hard mask layer 110, to appropriately reduce a removing amount during planarization subsequently performed on the channel material layer 300, thereby correspondingly helping to improve flatness of the top surface of the remaining channel material layer 300 in the groove 150 after the planarization.

Figure 25:
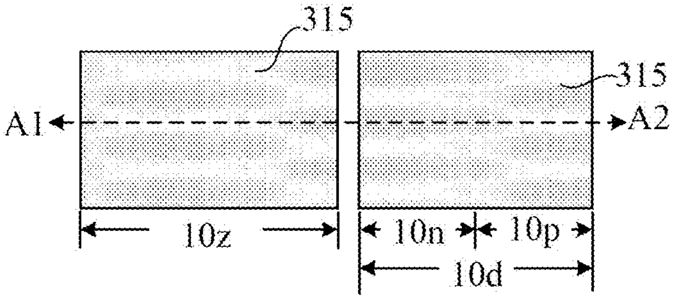
Figure 30:
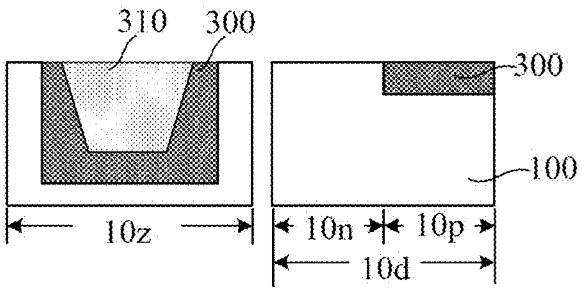

Referring to FIG. 25 and FIG. 30, the zero mark trench 120 is filled, to form a dielectric layer 310 (shown in FIG. 30) located in the zero mark trench 120.

A fin mask material layer covering the base 100 and the dielectric layer 310 is subsequently formed, a mandrel layer is formed on the fin mask material layer, then a mask spacer is formed on a side wall of the mandrel layer, and subsequently the mandrel layer is removed, where the dielectric layer 310 provides a planar surface for forming the fin mask material layer. Compared with a solution in which the fin mask material layer and the mandrel layer are directly formed after the zero mark trench is formed, a probability that a material residue of the fin mask material layer or the mandrel layer is formed on the side wall of the zero mark trench 120 is significantly decreased in this form. Correspondingly, after the fin is formed subsequently, a probability that the material residue causes a residue defect or a peeling defect is relatively low, thereby helping to enhance performance of the semiconductor structure.

The channel material layer 300 is formed at the bottom portion of and on the side wall of the zero mark trench 120, so that the dielectric layer 310 covers the channel material layer 300 in the zero mark trench 120.

The step of forming the dielectric layer 310 is described in detail below with reference to the accompanying drawings.

Figure 26:
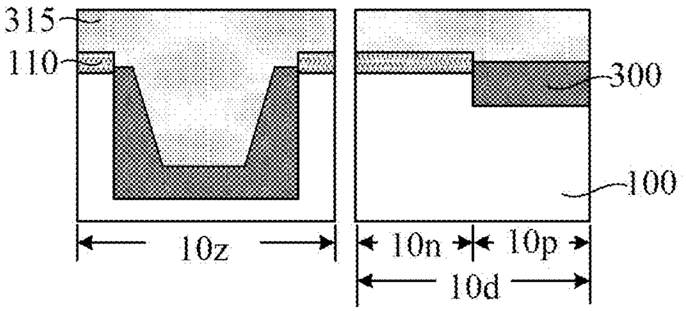

Referring to FIG. 25 and FIG. 26 in combination, where FIG. 25 is a top view based on FIG. 23, and FIG. 26 is a cross-sectional view of FIG. 25 along a section line A1A2, the zero mark trench 120 is filled with a dielectric material 315, and the dielectric material 315 further covers the base 100.

The dielectric material 315 is used for providing a process foundation for subsequently forming the dielectric layer.

In this form, the zero mark trench 120 is filled with the dielectric material 315 by using a deposition process (for example, a chemical vapor deposition process).

In this form, the dielectric material 315 further covers the hard mask layer 110 and the channel material layer 300.

The dielectric material 315 further covers the channel material layer 300. The dielectric material 315 is further used as a buffer layer in a subsequent process of performing planarization on the channel material layer 300, thereby improving a process window for performing planarization on the channel material layer 300.

The dielectric material 315 is filled into the zero mark trench 120. Selection of the dielectric material 315 facilitates obtaining a signal from the bottom portion of the zero mark trench 120 through the dielectric layer in a subsequent photolithography process, to reduce an impact on the signal strength during photolithography alignment. For example, the fin is subsequently formed using a SAMP process, and in a procedure of a photolithography process of forming the mandrel layer, the zero mark trench 120 is used as an alignment mark.

Specifically, the dielectric material 315 includes one or more of silicon nitride, silicon oxide, silicon oxycarbide, silicon oxynitride, and silicon oxycarbonitride. The materials above have relatively small impact on signal strength.

In this form, the dielectric material 315 is silicon nitride. Density of silicon nitride is relatively high. Therefore, selection of silicon nitride helps to improve an anti-oxidation effect of the dielectric material 315 on the channel material layer 300, thereby improving quality of the channel material layer 300.

Moreover, the material of the hard mask layer 110 is different from the material of the dielectric material 315. Therefore, during planarization subsequently performed on the dielectric material 315, a partial thickness of the dielectric material 315 can be first removed by using a top portion of the hard mask layer 110 as a stop position for the planarization, and then, the remaining dielectric material 315 higher than the top surface of the base 100 is removed, thereby improving effect uniformity of the planarization.

Figure 27:
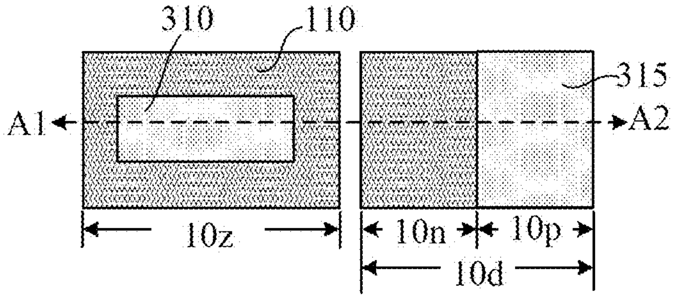
Figure 28:
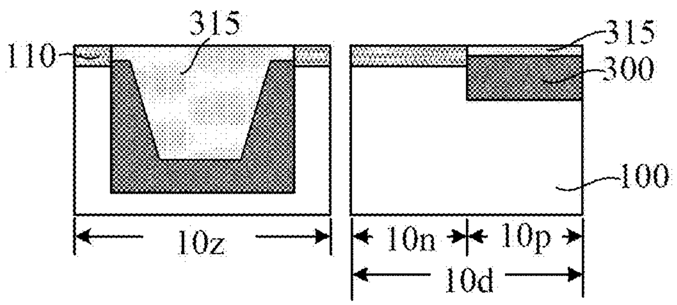
Figure 29:
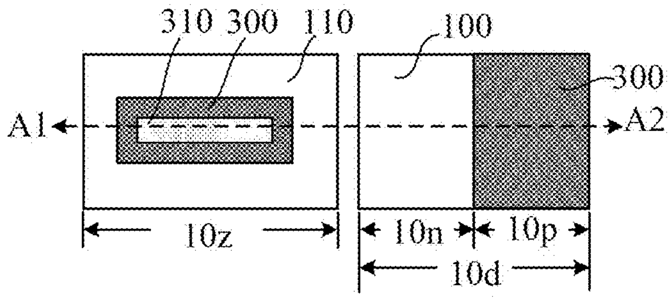

Referring to FIG. 27 to FIG. 30 in combination, where FIG. 27 is a top view based on FIG. 25, FIG. 28 is a cross-sectional view of FIG. 27 along a section line A1A2, FIG. 29 is a top view based on FIG. 30, and FIG. 30 is a cross-sectional view of FIG. 29 along a section line A1A2, planarization is performed on the dielectric material 315, to remove the dielectric material 315 higher than the top surface of the base 100, and retain the remaining dielectric material 315 in the zero mark trench 120 as the dielectric layer 310.

Specifically, as shown in FIG. 27 and FIG. 28, first planarization is performed on the dielectric material 315 by using the top portion of the hard mask layer 110 as a stop position; and as shown in FIG. 29 and FIG. 30, after the first planarization, second planarization is performed on the remaining dielectric material 315, until the top portion of the base 100 is exposed.

For example, the planarization is performed by using a chemical mechanical polishing process. Global planarization for an entire wafer is implemented by using the chemical mechanical polishing process.

In this form, during the planarization, the hard mask layer 110 and the channel material layer 300 higher than the top portion of the base 100 are removed. The hard mask layer 110 and the channel material layer 300 higher than the top portion of the base 100 are removed during the planarization, thereby simplifying process steps. In addition, by using the chemical mechanical polishing process, it is easy to simultaneously remove the hard mask layer 110 and the channel material layer 300 higher than the top portion of the base 100.

It should be noted that, in the step of forming the dielectric layer 310 located in the zero mark trench 120, a thickness of the dielectric layer 310 should be neither excessively small nor excessively large.

If the thickness of the dielectric layer 310 is excessively small, in a case that an epitaxial growth thickness of the channel material layer 300 is fixed, to enable the dielectric layer 310 to fill up the zero mark trench 120, the depth H3 of the zero mark trench 120 is correspondingly excessively small, which is prone to attenuate signal strength during photolithography alignment. Alternatively, in a case that the depth H3 of the zero mark trench 120 is fixed, the epitaxial growth thickness of the channel material layer 300 correspondingly needs to be increased, that is, to increase the thickness of the channel material layer 300 located in the zero mark trench 120. The material of the channel material layer 310 is close to the material of the base 100. When a signal is obtained, it is easy to mistakenly consider the top portion of the channel material layer 310 at the bottom portion of the zero mark trench 120 as the bottom portion of the zero mark trench 120, which also correspondingly attenuates the signal strength during photolithography alignment.

If the thickness of the dielectric layer 310 is excessively large, a filling amount of the dielectric material 315 in the zero mark trench 120 is relatively large. After planarization is performed on the material of the dielectric material 315, a probability that a top surface depression problem occurs on the dielectric layer 310 becomes higher.

Based on the above, in this form, the thickness of the dielectric layer 310 is from 100 Å to 1000 Å. That is, a distance between the bottom portion of the dielectric layer 310 and the top portion of the base 100 is from 100 Å to 1000 Å. For example, the thickness of the dielectric layer 310 is 300 Å, 500 Å, 700 Å, or 900 Å.

It should be further noted that, in an actual process, the depth H3 of the zero mark trench 120, the epitaxial growth thickness of the channel material layer 300, and the thickness of the dielectric layer 310 need to match with each other, so that when the depth H3 of the zero mark trench 120 and the thickness of the dielectric layer 310 meet process requirements, the channel material layer 300 can fill up the groove 150, and quality of the channel material layer 300 is relatively high.

In addition, in a process of performing planarization on the channel material layer 300, a buffer layer usually also needs to be covered first, and then planarization is performed on the buffer layer and the channel material layer 300. Therefore, in this form, the process of performing planarization on the channel material layer 300 is used for filling the zero mark trench 120 with the dielectric material 315 and performing planarization on the dielectric material 315. In this form, steps for performing filling the dielectric material 315 or for planarization are not added, thereby providing high process compatibility with a double channel process.

Figure 31:
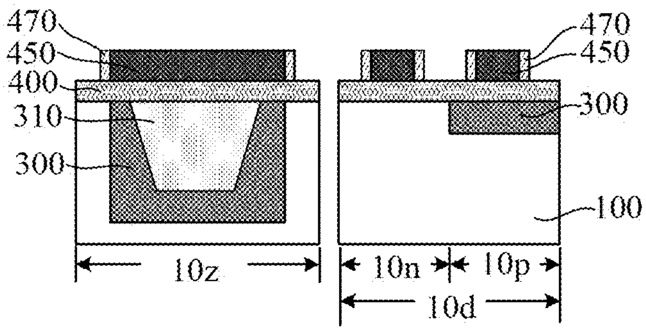

Referring to FIG. 31, where FIG. 31 is a cross-sectional view based on FIG. 30, a fin mask material layer 400 covering the base 100 and the dielectric layer 310 is formed.

The fin mask material layer 400 is used for providing a process foundation for subsequently forming a fin mask layer.

The material of the fin mask material layer 400 may include one or more of silicon oxide, silicon oxynitride, silicon nitride, silicon carbonitride, silicon oxycarbonitride, boron nitride, and boron carbonitride. For example, the material of the fin mask material layer 400 is silicon nitride.

In this form, the fin is formed by using a SAMP process, to increase density of the fin, and further reduce a pitch between neighboring fins, thereby enabling the photolithography process to overcome a limit of resolution in photolithography. For example, the SAMP process may include a self-aligned double patterning (SADP) process or a self-aligned quadruple patterning (SAQP) process.

For example, a description is made by using the SADP process as an example.

Still referring to FIG. 31, a mandrel layer 450 is formed on the fin mask material layer 400 above the dielectric layer 310 and the base 100 in the device region 10*d*, where the mandrel layer 450 covers the top portion of the zero mark trench 120.

The mandrel layer 450 provides a support for subsequently forming a mask spacer.

The mandrel layer 450 is further removed subsequently. Therefore, the mandrel layer 450 is of a material that is easily removed, and the process of removing the mandrel layer 450 causes relatively small damage to another film layer. Therefore, the material of the mandrel layer 450 includes a photoresist, amorphous carbon, silicon oxide, silicon nitride, silicon, titanium nitride, or the like. For example, the material of the mandrel layer 450 is silicon. Specifically, the material of the mandrel layer 450 is amorphous silicon.

Specifically, after a mandrel material layer covering the fin mask material layer 400 is formed, the mandrel material layer is patterned by using a mask, to form the mandrel layer 450 at a target position.

In this form, the mandrel layer 450 covers the top portion of the zero mark trench 120, so that after the mask spacer is subsequently formed on the side wall of the mandrel layer 450, the mask spacer exposes the channel material layer 300 and the dielectric layer 310 in the zero mark trench 120, to prevent a fin from being formed at a position of the zero mark trench 120.

Still referring to FIG. 31, a mask spacer 470 is formed on the side wall of the mandrel layer 450.

The mask spacer 470 is used as a mask for etching the fin mask material layer 400.

There is an etching selection ratio between the material of the mask spacer 470 and the material of the mandrel layer 450, to reduce damage caused by a process of removing the mandrel layer 450 to the mask spacer 470, and correspondingly guarantee profile quality and size accuracy of the mask spacer 470, thereby improving profile quality and size accuracy of the fin subsequently.

In this form, the material of the mandrel layer 450 is silicon. Correspondingly, the material of the mask spacer 470 is silicon nitride. Silicon and silicon nitride have a relatively high etching selectivity ratio, and hardness and density of silicon nitride are relatively high, so that the mask spacer 470 can preferably function as an etching mask.

Specifically, a mask spacer material layer conformally covering the mandrel layer 450 and the fin mask material layer 400 is formed using a deposition process, and the mask spacer material layer is etched using a maskless etching process, to form the mask spacer 470.

In this form, after the mask spacer 470 is formed, the forming method further includes: removing the mandrel layer 450.

The mandrel layer 450 is removed to prepare for etching the fin mask material layer 400. For example, the mandrel layer 450 is removed through etching by using a wet etching process.

Figure 32:
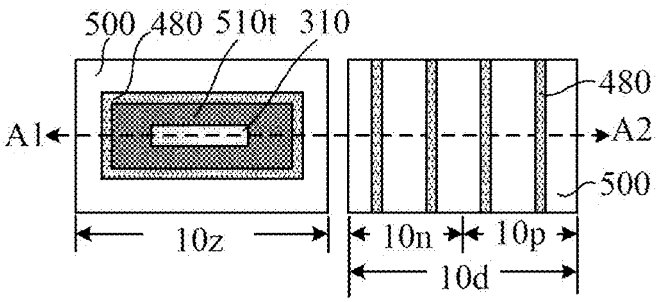
Figure 33:
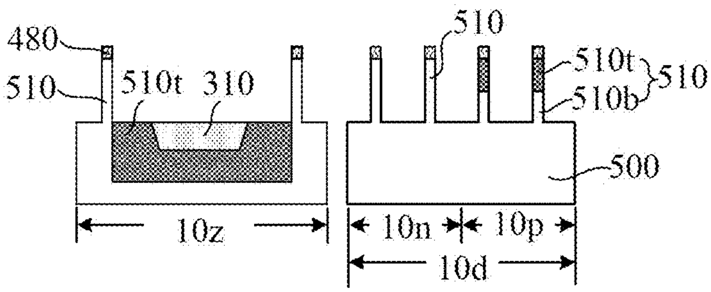

Referring to FIG. 32 and FIG. 33, where FIG. 32 is a top view, and FIG. 33 is a cross-sectional view of FIG. 32 along a section line A1A2, after the mandrel layer 450 is removed, the fin mask material layer 400 is etched using the mask spacer 470 as a mask, to form a fin mask layer 480; and a partial thickness of the base 100 is etched using the fin mask layer 480 as a mask, where the remaining base 100 after etching is used as a substrate 500, and a protrusion on the substrate 500 in the device region 10*d* is used as a fin 510. In addition, in a process of etching the base 100, a partial thickness of the dielectric layer 310 is etched simultaneously.

A pattern is first transferred to the fin mask material layer 400, and then the pattern is transferred to the base 100 using the fin mask layer 480, thereby improving accuracy of pattern transfer.

In this form, the channel material layer 300 is further formed in the groove 150. Correspondingly, in the step of etching a partial thickness of the base 100, the channel material layer 300 and the partial thickness of the base 100 are etched.

Correspondingly, in this form, in the device region 10*d* in which the channel material layer 300 is formed, the fin 510 includes a bottom fin layer 510*b* and a channel layer 510*t* located at a top portion of the bottom fin layer 510*b*, where the material of the channel layer 510*t* is different from the material of the bottom fin layer 510*b*. Specifically, the bottom fin layer 510*b* and the substrate 500 are an integral structure.

It should be noted that, the mask spacer 470 is further formed around the zero mark trench 120. Therefore, after the fin 510 is formed, the fin 510 is further formed in the zero mark region 10*z*, and surrounds the zero mark trench 120. The fin 510 in the zero mark region 10*z* is a dummy fin, and the fin 510 in the zero mark region 10*z* is not used for forming a transistor. In other forms, the fin in the zero mark region may alternatively be removed in a fincut manner according to a process requirement.

It should be further noted that, in a process of etching the fin mask material layer 400 and the base 100, the mask spacer 470 is prone to be damaged, and in a process of etching the base 100, the fin mask layer 480 may also be damaged to some extent. For example, after the fin 510 is formed, the mask spacer 470 has been removed, and a partial thickness of the fin mask layer 480 is still retained at a top portion of the fin 510.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:

a substrate, comprising a device region and a zero mark region, wherein the device region is separated from the zero mark region, the device region comprises a first device subregion configured for use in forming a first-type transistor and a second device subregion configured for use in forming a second-type transistor;

a fin, protruding on the substrate in the device region;

a zero mark trench, located inside the substrate in the zero mark region, wherein a top portion of the zero mark trench is flush with a top portion of the substrate; and a dielectric layer, filled in the zero mark trench and substantially absent from a top surface of the substrate outside the zero mark trench, wherein a first channel layer is located between a side wall of the zero mark trench and the dielectric layer, and between a bottom surface of the zero mark trench and a bottom surface of the dielectric layer, and a material of the first channel layer is a semiconductor material.

2. The semiconductor structure according to claim 1, wherein:

channel materials of the first-type transistor and the second-type transistor are different;

in the first device subregion, the fin comprises a bottom fin layer and a second channel layer located at a top portion of the bottom fin layer, where the material of the second channel layer is different from the material of the bottom fin layer.

3. The semiconductor structure according to claim 2, wherein channel conductivity types of the first-type transistor and the second-type transistor are different.

4. The semiconductor structure according to claim 2, wherein the material of the second channel layer comprises silicon, silicon germanium, germanium, or a III-V group semiconductor material.

5. The semiconductor structure according to claim 1, wherein a distance between a bottom portion of the zero mark trench and a top portion of the fin is from 600 Å to 1500 Å.

6. The semiconductor structure according to claim 1, wherein the material of the dielectric layer comprises at least one of silicon nitride, silicon oxide, silicon oxycarbide, silicon oxynitride, or silicon oxycarbonitride.

7. The semiconductor structure according to claim 2, wherein a distance between a bottom portion of the dielectric layer and a top portion of the fin is from 100 Å to 1000 Å.

* * * * *